(12) United States Patent
Reboh et al.

(10) Patent No.: US 11,610,806 B2
(45) Date of Patent: Mar. 21, 2023

(54) MULTILAYER STACK OF SEMICONDUCTOR-ON-INSULATOR TYPE, ASSOCIATED PRODUCTION PROCESS, AND RADIO FREQUENCY MODULE COMPRISING IT

(71) Applicant: COMMISSARIAT A L'ENERGIE ATOMIQUE ET AUX ENERGIES ALTERNATIVES, Paris (FR)

(72) Inventors: Shay Reboh, Grenoble (FR); Pablo Acosta Alba, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/124,142

(22) Filed: Dec. 16, 2020

(65) Prior Publication Data
US 2021/0210377 A1 Jul. 8, 2021

(30) Foreign Application Priority Data

Dec. 19, 2019 (FR) ..................... 19 15019

(51) Int. Cl.
*H01L 21/762* (2006.01)
*H01L 23/66* (2006.01)

(52) U.S. Cl.
CPC .. *H01L 21/76243* (2013.01); *H01L 21/76254* (2013.01); *H01L 23/66* (2013.01); *H01L 2223/6677* (2013.01)

(58) Field of Classification Search
CPC ......... H01L 21/76243; H01L 21/76254; H01L 33/66
See application file for complete search history.

(56) References Cited

U.S. PATENT DOCUMENTS

| 6,352,909 | B1 * | 3/2002 | Usenko | ............... H01L 21/2236 438/458 |
| 7,910,455 | B2 * | 3/2011 | Yoshida | ............ H01L 21/76256 438/455 |
| 8,614,501 | B2 * | 12/2013 | Landru | ............. H01L 21/76243 257/E21.24 |

(Continued)

OTHER PUBLICATIONS

French Preliminary Search Report dated Sep. 10, 2020 in French Application 19 15019 filed on Dec. 19, 2019 (with English Translation of Categories of Cited Documents and Written Opinion), 12 pages.

*Primary Examiner* — Dale E Page
*Assistant Examiner* — Quovaunda Jefferson
(74) *Attorney, Agent, or Firm* — Oblon, McClelland, Maier & Neustadt, L.L.P.

(57) ABSTRACT

A production method for a semi-conductor-on-insulator type multilayer stack includes ion implantation in a buried portion of a superficial layer of a support substrate, so as to form a layer enriched with at least one gas, intended to form a porous semi-conductive material layer, the thermal oxidation of a superficial portion of the superficial layer to form an oxide layer extending from the surface of the support substrate, the oxidation and the implantation of ions being arranged such that the oxide layer and the enriched layer are juxtaposed, and the assembly of the support substrate and of a donor substrate.

13 Claims, 6 Drawing Sheets

(56) References Cited

U.S. PATENT DOCUMENTS

| | | | |
|---|---|---|---|
| 2006/0091400 A1* | 5/2006 | Faure | H01L 21/76254 257/76 |
| 2006/0148208 A1* | 7/2006 | Popov | H01L 21/26506 438/516 |
| 2011/0131542 A1* | 6/2011 | Botula | H01L 21/26506 716/136 |
| 2016/0276209 A1* | 9/2016 | Usenko | H01L 21/76254 |
| 2017/0221839 A1* | 8/2017 | Kononchuk | H01L 21/76251 |
| 2018/0033681 A1* | 2/2018 | Ishikawa | H01L 29/78603 |
| 2018/0138080 A1 | 5/2018 | Unsenko | |

* cited by examiner

MULTILAYER STACK OF SEMICONDUCTOR-ON-INSULATOR TYPE, ASSOCIATED PRODUCTION PROCESS, AND RADIO FREQUENCY MODULE COMPRISING IT

TECHNICAL FIELD

The present invention relates to the field of semi-conductor-on-insulator type multilayer stacks and the production method thereof. Generally, the field of microelectronic devices is targeted. By microelectronic device, this means any type of device produced with microelectronic means. These devices comprise in particular, in addition to devices with a purely electronic purpose, micromechanical or electromechanical devices (MEMS—microelectromechanical systems, NEMS—nanoelectromechanical systems, etc.), as well as optical or optoelectronic devices (MOEMS—Micro-Opto-Electro-Mechanical Systems, etc.) It has a particularly advantageous application of the field of radiofrequency modules (RF, below), and in particular front-end modules.

STATE OF THE ART

Radiofrequency modules are critical elements for the correct operation of cell and Wi-Fi systems. For example, among these modules, front-end RF modules act as an interface between an antenna and an RF transceiver. A front-end RF module comprises, generally, sensitive components such as a low-noise amplifier of the signal received by the antenna, power amplifiers, switches for adjusting the antenna and a power management unit.

The production of these modules has numerous design challenges, such as the insulation of linear switches and the maximisation of the effectiveness of the power amplifiers. According to the conventional approach of producing these modules, specific methods have been developed for each portion of the front-end RF module, leading to multiple different components and multiple integrated circuits.

At the same time, new high-speed technologies are developed in cell and W-Fi systems. Today, 4G and 5G cell systems become high-speed standards, and use up to forty different frequency bands to increase the quantity of data exchanged. This is therefore about complexifying these systems, and in particular incorporating additional front-end RF modules, which leads to a significant increase of the size of the systems when the conventional approach is followed.

The growing increase in the complexity of these systems therefore demands to develop new methods to obtain multilayer stacks allowing a greater flexibility and a better integration in the production of RF modules, and in particular front-end RF modules, without deteriorating the performance obtained. In this context, the use of silicon-on-insulator (SOI) type multilayer stacks, for technologies called RF-SOI, responds to the technical requirements and to the desired performances, while allowing a high level of integration.

Today, methods for producing SOI type multilayer stacks, in particular for RF-SOI technologies, are mainly based on the deposition of polycrystalline silicon (also called Poly-Si) on the surface of a support substrate followed by a method commonly called Smart-Cut®. In this method, the support substrate and a donor substrate are assembled by way of a silicon oxide layer disposed either on the support substrate, or on the donor substrate, or on both.

This method generally requires a treatment of the surface of the Poly-Si layer in order to decrease the roughness thereof, and thus favour the bonding of the donor substrate and of the support substrate. Typically, it is sought to obtain an average quadratic roughness less than 1 nm. This can be done by a chemical and/or mechanical polishing. This however increases the cost and the complexity of the method.

Furthermore, during an oxidation of the polycrystalline silicon, different oxidation rates can be created between silicon grains having orientations and of different sizes, thus decreasing the homogeneity of the layer. Grain boundaries can induce inhomogeneities and variations of the thickness of the silicon oxide layer formed. In particular, this can disrupt thickness measurements on the multilayer stack. The quality, even the thickness of silicon oxide formed is therefore limited, which can restrict the applications of the SOI-type multilayer stack, and in particular for certain RF-SOI applications.

As an alternative to the oxidation of polycrystalline silicon, it is possible to deposit a thick layer of silicon oxide on the polycrystalline silicon layer. However, the insulating properties of this layer are limited.

An aim of the present invention is therefore to propose a method for manufacturing a semi-conductor-on-insulator type multilayer stack, for example of SOI type, and in particular for RF-SOI technologies, of which the properties are improved. A non-limiting aim of the invention can be to propose a new type of trapping layer adapted to the RF application, while facilitating the manufacturing of a semi-conductor-on-insulator type substrate, for example of SOI type, and in particular for RF-SOI technologies comprising this trapping layer. Another aim of the invention is to propose an SOI type multilayer stack, of which the properties are improved. A non-limiting aim of the invention can be to improve the quality of the bonding surface between the support substrate and the donor substrate. Another non-limiting aim of the invention can be to improve the quality, even to authorise an enlargement of the thickness of the oxide layer.

Other aims, features and advantages of the present invention will appear upon examining the following description and supporting drawings. It is understood that other advantages can be incorporated.

SUMMARY

To achieve this aim, according to an embodiment, a method for producing a semi-conductor-on-insulator type multilayer stack is provided, the method comprising:
- a provision of a support substrate, the support substrate comprising a superficial layer based on a monocrystalline semi-conductive material, then
- an ion implantation selected from among noble and hydrogen gas ions in a buried portion of the superficial layer of the support substrate at a depth of the surface of the superficial layer, so as to form a layer enriched with at least one gas, formed from said ions, in said buried portion, said layer enriched with at least one gas being intended to form a porous semi-conductive material layer,
- a thermal oxidation of at least one superficial portion of the superficial layer of the support substrate, to form an oxide layer extending from the surface of the superficial layer of the support substrate, the oxidation and the implantation of ions being configured such that the oxide layer and the layer enriched with at least one gas are juxtaposed, a provision of a donor substrate, the donor substrate comprising a superficial donor layer, having a surface, then an assembly of the support substrate and of the donor substrate.

The semi-conductive material porous layer (which can be silicon) being obtained by ion implantation, it is possible to obtain a porous semi-conductive material layer in a localised manner in the superficial layer of the support substrate, at least in the depth of the layer. The method allows to obtain a semi-conductor-on-insulator type stack, for example of SOI type, containing a porous semi-conductive layer juxtaposed to an oxide layer buried in the stack. Thus, the layer of a porous semi-conductive material forms a load trapping layer, could be designated by the expression "trap-rich layer", allowing to improve the performances of the SOI type multilayer stack, in particular for RF-SOI technologies. Furthermore, according to the parameters of ion implantation, and in particular according to the chemical nature of the ions and the implantation energy, the implantation depth in the superficial layer of the support substrate can be adjusted. With the oxide layer and the porous semi-conductive material layer being juxtaposed, and the oxide layer extending from the surface of the superficial layer of the support substrate, it is understood that the thickness of the buried oxide layer can be modulated.

Moreover, the buried oxide layer is obtained by thermal oxidation of the monocrystalline semi-conductive material. The oxide layer on the surface of the support substrate thus has a sufficiently low roughness to not have to mechanically and/or chemically polish the oxide layer prior to the assembly of the support substrate and of the donor substrate. The method for producing the multilayer stack is thus facilitated. The quality of the interface created by bonding between the support substrate and the donor substrate is further improved.

Advantageously, the ion implantation in the buried portion of the superficial layer of the support substrate, can precede the thermal oxidation of the superficial portion of the superficial layer of the support substrate. Thus, a possible disruption of the ion implantation in the buried portion, by the oxide layer is avoided. The ion implantation at a significant depth of the support substrate is thus facilitated. A buried oxide layer obtained, by thermal oxidation, thicker than in the state of the art can thus be obtained. Furthermore, by carrying out the thermal oxidation after the ion implantation, the risk of a possible deterioration of the oxide layer by ion implantation in the buried portion, is minimised, even avoided. This allows to avoid the creation of defects in the oxide, in particular the creation of charge carriers which could reduce the performances of the stack. Furthermore, by carrying out the thermal oxidation after ion implantation and the formation of the porous layer, it is possible to transform by oxidation at least one portion of the porous layer.

According to an example, the oxide layer of the superficial layer of the support substrate can be intended to form at least one assembly surface during the assembly of the support substrate and of the donor substrate.

According to an example, the support substrate and the donor substrate are assembled so as to associate the surface of the support substrate to the surface of the donor substrate, and more specifically, the surface of the respective superficial layer thereof.

According to an example, the semi-conductive material can be selected from among silicon, or semi-conductive silicon alloys such as silicon carbide of formula SiC and a silicon-germanium alloy of formula Si—Ge. According to a more particular example, the silicon-based semi-conductive material.

Preferably, the donor substrate comprises a monocrystalline semi-conductive material-based donor superficial layer. Furthermore, the method can comprise a formation of a weakening zone at a depth of the surface of the superficial donor layer of the donor substrate, then a separation of the donor substrate at the level of the weakening zone.

According to a separable or complementary aspect, a method for producing a semi-conductor-on-insulator type multilayer stack can be provided, the method comprising:

a provision of a support substrate, the support substrate comprising a superficial layer based on a monocrystalline semi-conductive material, then an ion implantation selected from among noble and hydrogen gas ions in a buried portion of the superficial layer of the support substrate at a depth of the surface of the superficial layer, so as to form a layer enriched with at least one gas, formed from said ions, in said buried portion, said layer enriched with at least one gas being intended to form a porous semi-conductive material layer, a provision of a donor substrate, the donor substrate comprising a superficial donor layer, comprising an oxide layer, an assembly of the support substrate and of the donor substrate.

The oxide layer does not therefore disrupt the ion implantation in the support substrate, and the risk of a possible deterioration of the oxide layer by the ion implantation in the buried portion, is avoided. Furthermore, the thickness of the oxide layer on the donor substrate is thus not limited by the formation of the porous semi-conductive material layer.

Preferably, the assembly of the support substrate is done after ion implantation. The method can be configured such that the oxide layer of the donor substrate and the layer enriched with at least one gas are juxtaposed.

According to an example, the oxide layer can extend to the surface of the superficial donor layer of the donor substrate. The ion implantation and the assembly, even at least one step of the method prior to the assembly, are preferably configured such that the oxide layer of the donor substrate and the layer enriched with at least one gas are juxtaposed.

According to a separable or complementary aspect, a method for producing a semi-conductor-on-insulator type multilayer stack, the method comprising:

a provision of a support substrate, the support substrate comprising a superficial layer based on a monocrystalline semi-conductive material, an ion implantation selected from among noble and hydrogen gas ions in a buried portion of the superficial layer of the support substrate, at a depth P1 of the surface of the superficial layer, so as to form a layer enriched with at least one gas, formed from said ions, in said buried portion, said layer enriched with at least one gas being intended to form a porous semi-conductive material layer, a provision of a donor substrate, the donor substrate comprising a superficial donor layer, having a surface, a thermal oxidation of at least one superficial portion of one from among the support substrate and the donor substrate, to form an oxide layer extending from the surface of the superficial layer, an assembly of the support substrate and of the donor substrate.

According to a second aspect, the invention relates to a semi-conductor-on-insulator multilayer stack, the multilayer stack comprising:
- a support substrate comprising a first layer based on a monocrystalline semi-conducive material,
- a buried semi-conductor material oxide layer,
- a second monocrystalline semi-conductive material-based layer, juxtaposed to the oxide layer.

Advantageously, the multilayer stack comprises a porous semi-conductive material layer, juxtaposed between the first monocrystalline semi-conductive material-based layer and the oxide layer.

Preferably, the second monocrystalline semi-conductive material layer is situated on the surface of the multilayer stack.

The multilayer stack according to this aspect of the invention can in particular be obtained by the method according to the first aspect and/or according to one of the aspects of the invention. The SOI type stack contains a porous semi-conductive material layer juxtaposed to a buried oxide layer in the stack.

According to a third aspect, the invention relates to a radiofrequency module comprising a multilayer stack according to the second aspect of the invention.

BRIEF DESCRIPTION OF THE FIGURES

The aims, objectives, as well as the features and advantages of the different aspects of the invention will better emerge from the detailed description of embodiments of these different aspects, illustrated by the following supporting drawings.

The drawings are given as examples and are not limiting of the invention. They constitute principle schematic representations intended to facilitate the understanding of the invention and are not necessarily to the scale of practical applications. In particular, the relative substrate, layer, zone or portion thicknesses and dimensions illustrated are not representative of reality.

DETAILED DESCRIPTION

Before starting a detailed review of embodiments of the invention, below optional features of the method are stated according to the first aspect and/or according to one of the aspects of the invention which can possibly be used in association or alternatively:
- the ion implantation in the buried portion of the superficial layer of the support substrate, is done through a non-oxidised portion of the superficial layer of the support substrate. The oxide layer does not thus disrupt the ion implantation in the support substrate, and the risk of a possible deterioration of the oxide layer by ion implantation in the buried portion, is minimised, even avoided. Preferably, the thermal oxidation can be carried out on the donor substrate, and/or on the support substrate following the ion implantation,
- the thermal oxidation forming the oxide layer forms a juxtaposition interface with the layer enriched with at least one gas, wherein at least one portion of the layer enriched with at least one gas is oxidised. Thus, a portion of the porous layer at the interface with the oxide layer can be at least partially oxidised at the level of this interface,
- the juxtaposition interface has a thickness substantially comprised between 3 nm and 100 nm,
- the method can be exempt from a polishing of the surface of at least one from among the superficial layer of the support substrate and the superficial donor layer of the donor substrate, prior to the assembly of the support substrate and of the donor substrate,
- the method can further comprise, between the ion implantation in the buried portion of the superficial layer of the support substrate and the thermal oxidation of the superficial portion of the superficial layer of the support substrate, an epitaxial growth of a semi-conductive material layer on the surface of the superficial layer of the support substrate,
- the ion implantation in the buried portion of the superficial layer of the support substrate, can follow the thermal oxidation of the superficial portion of the superficial layer of the support substrate and precede the assembly of the support substrate and of the donor substrate, the method can further comprise a thermal annealing of the support substrate following the ion implantation in the buried portion of the superficial layer of the support substrate. In a particular embodiment, the thermal annealing is carried out between the ion implantation and the thermal oxidation, the thermal annealing can comprise an exodiffusion annealing to discharge the at least one gas of said enriched layer, the ion implantation in the buried portion of the superficial layer of the support substrate can be carried out at an implantation energy comprised between 0.5 keV and 1 MeV, preferably between 1 keV and 200 keV, the method can comprise several ion implantations, preferably successive, when the method comprises several ion implantations, the chemical elements of the ions and/or the relative proportions between ions of different chemical elements vary between the different ion implantations. Thus, the implanted ions can be ions of different chemical elements. For example, hydrogen ions are implanted in an implantation, and helium ions are implanted in another implantation. In the case of the implantation of a mixture of ions, relative proportions between the different ions of the mixture can vary between several implantations. Alternatively or complementarily, in at least one implantation, one single type of ion can be implanted, and in at least one other implantation, a mixture of ions can be implanted. Alternatively or complementarily, several mixtures of ions can be implanted, the mixtures varying between the different implantations, for example by the chemical elements of the ions, even the relative proportions thereof between ions of different chemical elements, when the method comprises several ion implantations, at least one from among several ion implantations can be carried out at a different implantation depth with respect to the implantation depths of the other ion implantations, when the method comprises several ion implantations, at least one from among the several ion implantations is configured to implant a different dose with respect to the doses implanted of the other ion implantations.

Optional features of the multilayer stacks according to the second aspect of the invention are stated below, which can possibly be used in association or alternatively:

the oxide layer can be of a thickness comprised between 20 nm and 3 μm, preferably comprised between 50 nm and 2 μm.

the porous semi-conductive material layer can comprise several juxtaposed sublayers, at least one from among the sublayers have pores of a diameter different from the pores of the other sublayers.

It is specified that in the scope of the present invention, the term "on", "surmounts" or the equivalents thereof do not necessarily mean "in contact with", unless otherwise specified as "juxtaposed". By "juxtaposed" layers, or portions, or zones, this means here that the layers, or portions, or zones are in contact along the main extension plane thereof and disposed on top of one another along the direction of the stack, this direction being perpendicular to the main extension plane. By "in contact", this means that a thin interface can exist, caused by the manufacturing variability. In the scope of the invention, this interface is negligible regarding the effect thereof induced, and in particular on the electrical properties. Consequently, despite all, these layers, or portions, or zones, are considered as being in contact. For example, in the arrangement of a first layer in contact with a second layer, a thin interface of a thickness less than 3 nm can exist, more specifically formed of material of the substrate in the non-oxidised state.

In the following description, the layer, zone or portion thicknesses, as well as the depths are generally measured along a vertical direction, parallel to the stack direction and perpendicular to the main extension plane of the substrate, of the layer, of the sublayer or of the portion.

By a substrate, a layer, a zone or a portion "based on" a material A, this means a substrate, a layer, a zone or a portion comprising this material A, for example at the height of at least 50%, and possibly of other materials, for example doping elements.

By "enriched layer", it is understood that the layer comprises, as an additional element, the at least one gas coming from implanted ions.

By a parameter "substantially equal to/greater than/less than" a given value, this means that this parameter is the given value, to more or less almost 10%, even to more or less almost 5%, of this value.

By porosity of a layer, a sublayer, a zone or a portion, this means the space or gas proportion in the layer, the sublayer, the zone or the portion. The pores can be in the form of cavities and/or bubbles. By "cavity", this means a space volume. By "bubbles", this means a space volume. By "bubbles", this means a gas-filled volume.

By "direct bonding", this means a bonding without applying adhesive material (or glue or polymer type, in particular), which consists of the putting into contact of relatively smooth surfaces (of a roughness typically less than 5 Å, $10^{-9}$), for example done at ambient temperature and under ambient atmosphere, in order to create an adherence between them.

According to an embodiment, the direct bonding of two substrates means that the bonding is obtained by chemical bonds which are established between the two surfaces put into contact.

The direct bonding can be obtained without requiring the application of a significant pressure on the structure to be assembled. A slight pressure can simply be applied to initiate the bonding. A thermal annealing can be further carried out to initiate the bonding.

In the scope of the invention, the energies are given in electron volts, for which 1 eV≈1.602·$10^{-19}$ J, in the international unitary system.

The method for producing a silicon-on-insulator (abbreviated to SOI below in the description) type multilayer stack, is now described in reference to FIGS. 1 to 13A.

Figure 1:
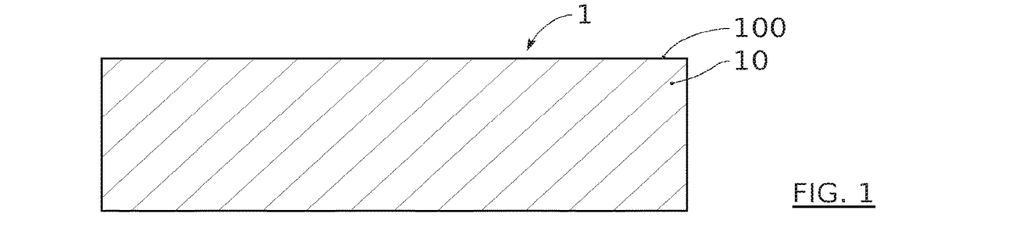
FIG. 1 represents a schematic and transversal cross-sectional view of the superficial layer of a support substrate implemented in the method according to an embodiment.

The method first comprises the provision of a support substrate 1, as illustrated in FIG. 1. This support substrate 1 comprises a monocrystalline semi-conductive material-based superficial layer 10. As an example, the semi-conductive material can be selected from among silicon, or semi-conductive silicon alloys such as silicon carbide of formula SiC and a silicon-germanium alloy of formula Si—Ge. Below, the case where the semi-conductive material is silicon-based, is referred to. It is noted that in FIGS. 1 to 7 and 11A to 12B, only the superficial layer 10 of the support substrate 1 is represented. The substrate 1 can however be in the form of a stack of a plurality of layer, for example based on different materials. The layer 10, is therefore situated on the surface of the support substrate 1 and has an exposed surface 100. The layer 10 can further be only constituted of monocrystalline silicon, by neglecting the impurities linked to the production of silicon. The support substrate 1 can, for example, be a silicon wafer.

Figure 1A:
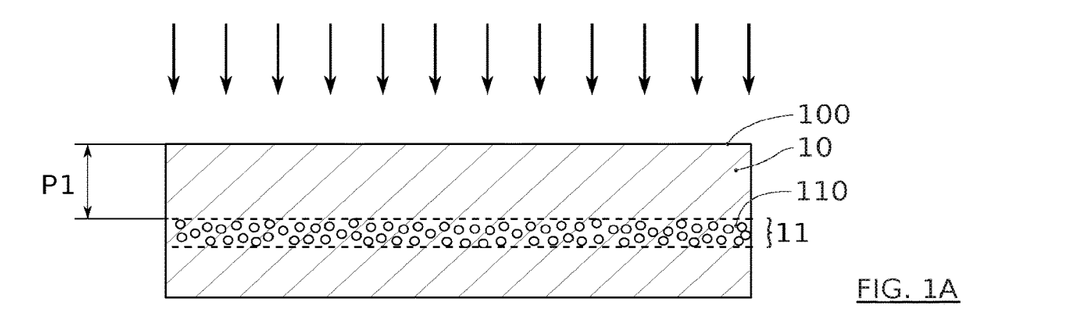
FIGS. 1A to 1C illustrate the ion implantation, according to several embodiments of the method according to the invention, in a portion of the superficial layer of the support substrate illustrated in FIG. 1.
Figure 1B:
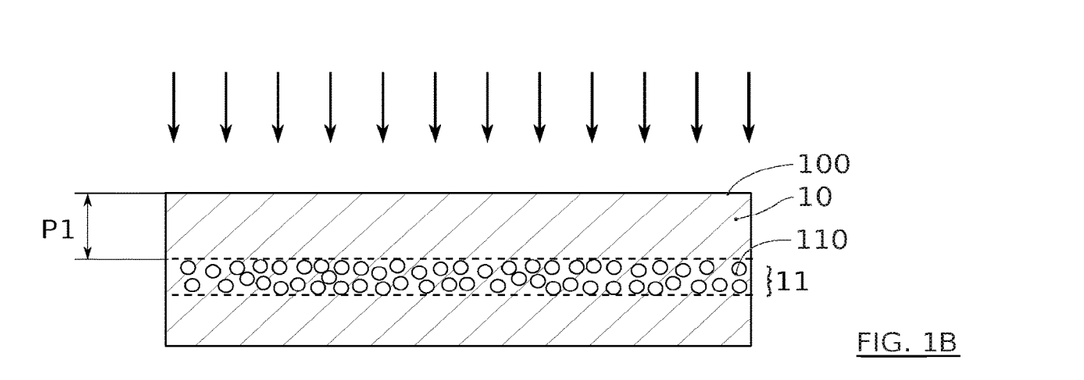
Figure 1C:
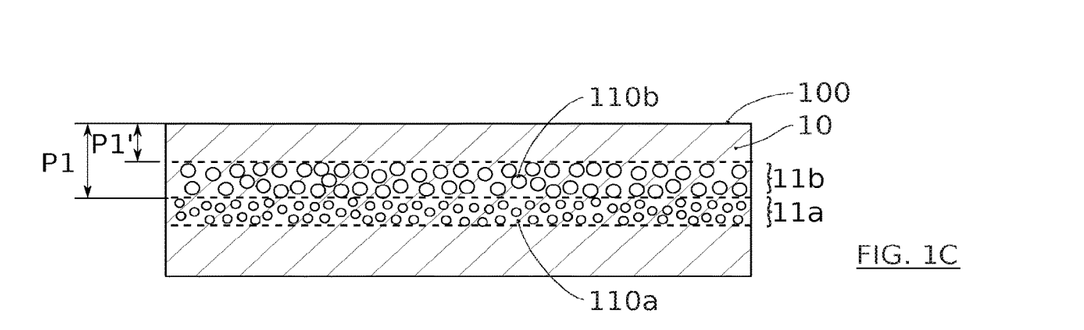

The ion implantation is described in reference in FIGS. 1A to 1C. The ion implantation is implemented on the substrate 1 so as to implant ions in a portion 11 of the superficial layer 10, in a localised manner along a direction perpendicular to a main extension plane of the layer 10. Thus, the implanted portion does not extend into the whole thickness of the superficial layer 10 of the substrate 1. This portion 11 extends more specifically along one of the main extension planes of the superficial layer 10. The ion implantation is such that the portion 11 is situated at a depth P1 of the exposed surface 100 of the layer 10. The depth P1 is, for example, greater than or equal to 1 nm even more, so as to not modify the surface 100. The portion 11 is therefore buried with respect to the surface 100 of the superficial layer 10. The portion 11 will therefore be designated buried portion 11. For this, the superficial layer 10 is subjected to an ion flow at a given implantation energy, and so as to implant an ion dose in the superficial layer 10.

The ion implantation thus induces the formation of a layer enriched with at least one gas at the level of the buried portion 11. This layer enriched with gas can be in the form of a microstructure of pores 110 allowing to form the porous layer, for example when the ion implantation is carried out with a high dose. In an alternative, the layer enriched with gas cannot be in the form of a microstructure of pores 110 following the implantation step, in particular in the case where the gas is diffused in this layer, for example when the ion implantation is carried out with a lower dose. The pore 110 can in particular be formed during an annealing, subsequently described in more detail. Below, the generic term of microstructure 110 is designated to designate these different aspects of the layer enriched with gas. According to an example, at least 70%, and preferably at least 85%, even 100% of the pores can be insulated from one another in the microstructure 110 formed, to increase the surface of the pores in the porous layer 11'.

The buried portion 11 is thus intended to come from the method to form a porous silicon layer 11'. Preferably, the buried portion 11 extends substantially in the whole main extension plane of the layer 10, at the depth P1. According to a particular embodiment, the buried portion 11 extends substantially in the whole main extension plane of the layer 10, and in particular in an uninterrupted manner. According to another embodiment, the method can comprise the application of a mask on a fraction of an exposed surface of the support substrate 1, prior to the ion implantation, as well as an annealing of the mask after the ion implantation. Thanks to the application of a mask, the ion implantation can be carried out in at least one fraction of the layer 10 along a main extension plane of this layer. The porous portion formed in the layer can thus be split.

According to the parameters of the ion implantation, the parameters of the buried portion 11, as well as the microstructure 110 formed can be modified. For this, the main parameters of the ion implantation comprise the nature of the implanted ions, and in particular the chemical element of the implanted ions, the implantation temperature and more specifically the temperature of the substrate 1 during the implantation, the implantation current, the implantation energy and the implanted dose. For example, calculation tools for stopping and supporting ions in matter (which can be abbreviated SRIM—Stopping and Range of Ions in Matter) can be used to determine the penetration of ions in the matter.

The ion implantation can more specifically be carried out at a temperature comprised between substantially −200° C., corresponding to the temperature of the liquid nitrogen, and 1200° C.

The implantation energy impacts in particular over the implantation depth of the layer enriched in gas. The implantation energy can more specifically be comprised between 0.5 keV and 1 MeV, and preferably between 1 keV and 200 keV. In this range of energy, the depth P1 of ion implantation can be modulated.

The dose of implanted ions can be comprised between $10^{14}$ and $10^{1}$ ions/cm$^2$, and preferably between $10^{16}$ and $5·10^{17}$ ions/cm$^2$. A range of dose of implanted ions comprised between preferably $10^{16}$ and $5·10^{17}$ ions/cm$^2$ is particularly adapted to obtain a porous silicon layer, in particular when the implanted ions are hydrogen and/or noble gas ions, such as helium, neon and argon. It is noted that the implantation parameters, and for example the dose, are selected so as to limit, even avoid, the exfoliation or the cleaving of the surface 100 of the support substrate 1. For example, a high dose of hydrogen ions can cause a superficial exfoliation during the annealing subsequently described.

According to a first example illustrated in FIG. 1A, ions are implanted in the layer 10 by the surface 100 thereof, as represented by the arrows. This results in the buried portion 11, situated at a depth P1. The thickness of the buried portion 11 can be modulated. For example, the thickness of the buried portion 11 can be increased by increasing the implanted dose or by carrying out multiple implantations at different energies.

Ions of different chemical natures, and more specifically of different chemical elements, can be implanted, even a mixture of ions of different chemical natures can be implanted. Gas ions, even a mixture of gas ions, are implanted. According to an example, hydrogen and/or noble gas ions, or equivalently rare gas ions, even a mixture of hydrogen and/or noble gas ions, are implanted. Noble gas ions are selected from among helium, neon, argon, krypton, xenon and radon ions. Preferably, helium, argon, neon, xenon ions, or the mixture thereof can be implanted.

According to the nature of the gas, the microstructure 110 can be modified. The method consequently allows to adjust the porosity of the semi-conductive layer in an extended pore size range.

According to a second example, illustrated in FIG. 1B, ions are implanted at a depth P1 in the layer 10, as represented by the arrows, these ions being of a different chemical nature with respect to the chemical nature of the ions implanted in the first example. The pores 110 according to this example have a diameter greater than that of the pores 110 formed in the first example. As an example, for a given dose, the implantation of neon ions, with certain parameters of ion implantation, can allow to form pores of diameter greater than that of pores formed by hydrogen ion implantations at the same dose.

It is noted that in the two examples described above, the depths P1 can vary from one example to another, and for example according to the implantation energy used.

The pores in the porous silicon layer 11' form trapping sites, for example for metal atoms present in the superficial layer 10. Other ions can moreover be introduced for example by implantation, so as to be trapped in the pores. Carbon can moreover be implanted before or after ions likely to form pores in the buried portion 11.

Furthermore, the method can comprise several ion implantations, preferably successive. These ion implantations can be configured so as to form microstructures in several buried sub-portions 11a, 11b in the layer 10. These buried sub-portions 11a, 11b can in particular be formed at several depths P1, P1' of the layer 10. Preferably, the ion implantations are configured such that the buried sub-portions 11a, 11b are juxtaposed along a direction perpendicular to the surface 100 of the superficial layer 10 of the support substrate 1. These ion implantations can further be configured such that the microstructures 110a, 110b are different between the buried sub-portions 11a, 11b. In a synergetic matter, the implantation of different ions or of different mixtures of ions, at different depths in the superficial layer 10, allows, in particular to form a porous silicon layer 11' having different porosities, even a porosity gradient, along a direction perpendicular to the main extension direction of the porous silicon layer 11'.

As an example, a first ion implantation can be carried out. As illustrated in FIG. 1C, a microstructure 110a can be obtained in a buried sub-portion 11a, at a depth $P_1$ of the layer 10. Following this first implantation, a second ion implantation can be carried out, with different implantation parameters, so as to obtain a different microstructure 110b, in a buried sub-portion 11b at a depth $P_2$ of the layer 10, and juxtaposed to the sub-portion 11a. According to this example, the diameter or the volume density of the pores 110b can more specifically be greater than the diameter of the pores 110a or vice versa.

Figure 2A:
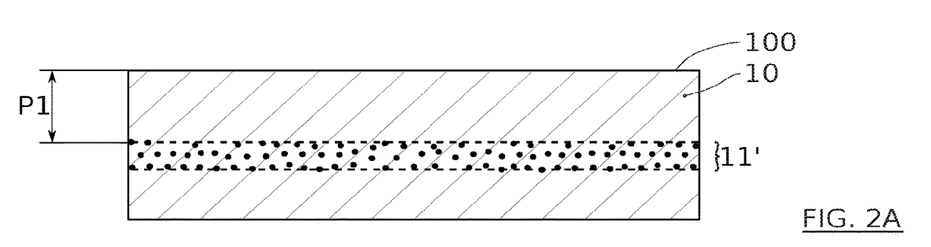
FIGS. 2A and 2B represent the support substrate obtained after a thermal annealing, according to an embodiment of the method according to the invention, made on the superficial layer illustrated by each of FIGS. 1A and 1B.
Figure 2B:
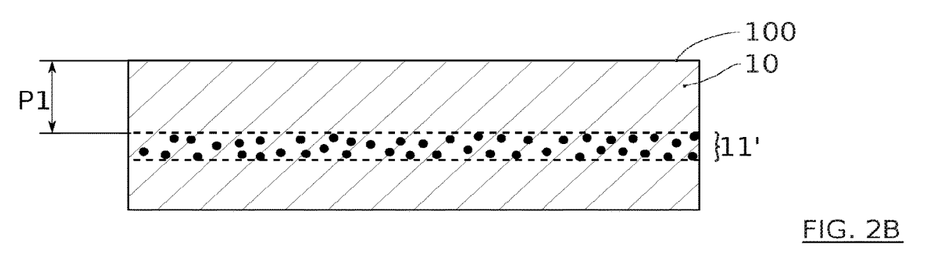

The method can then comprise a thermal annealing of the support substrate 1. This thermal annealing can be configured to form the pore microstructure as a share of the layer enriched with gas, or modify the pore microstructure 100 formed beforehand. For this, the thermal annealing can be carried out at a temperature greater than at least one temperature of the ion implantation. As an example, the diameter of pores formed following an ion implantation of neon and following a thermal annealing at 1100° C., can increase with respect to the diameter thereof before annealing, as described in document *Caracterização da implantaç~ ao de Ne em Si* (100), Suzana Bottega Peripolli, Federal University of Rio Grande do Sul, 2007.

According to an example, an implantation of helium ions at a dose of $9 \cdot 10^{15}$ ions/cm$^2$ at an implantation energy of 40 keV at ambient temperature followed by a thermal annealing will form a diluted microstructure of large plate-shaped pores. According to another example, the same implantation carried out at 350° C. followed by a thermal annealing will form a microstructure of small pores, in particular spherical.

Furthermore, this annealing can be configured to discharge the gas of bubbles 110 in the buried portion 11, to obtain cavities 110. This annealing can subsequently be designated exodiffusion annealing. The gas is thus discharged by effusion of the microstructure, i.e. that the gas molecules diffuse through the superficial layer 10. The risk of degrading the state of the surface 100 of the superficial layer 10 during the thermal oxidation is thus minimised, even avoided. Indeed, if the thermal oxidation is carried out after the ion implantation in the buried portion 11, without this thermal annealing, there is a risk that the gas of bubble 110 induce a deformation of the exposed surface 100, even that the gas escapes explosively to the surface 100. This can induce an increase of the roughness of the surface 100.

According to an example, the annealing is configured so as to avoid the formation of a pore network from the microstructure 110. Preferably, the pores can be insulated from one another, to increase the surface of the pores in the porous layer 11'. According to an alternative example, the pores can be interconnected with one another.

Preferably, the temperature of the thermal annealing is comprised between 150° C. and 1100° C.

Furthermore, the annealing can be a laser annealing. During a laser annealing, the temperature of the annealing can increase up to the melting temperature of the superficial layer 10. In particular, a laser annealing, the wavelength of the laser being selected so as to not be absorbed significantly by the silicon oxide layer 12'. For example, a wavelength in the ultraviolets can be selected, and more specifically a wavelength of 308 nm. The laser can be a pulsed laser, i.e. that the surface 100 of the superficial layer 10 is subjected to a laser radiation intermittently by at least one laser pulse. The pulse can be of a duration going from one nanosecond to one microsecond.

The method could comprise several ion implantations, the method can comprise a thermal annealing, carried out between or following ion implantations. The method can comprise several thermal annealings, for example following each of the ion implantations. For example, several implantations of one same ion or mixture of ions and at the same depth P1, each followed by an exodiffusion annealing, can be carried out, so as to increase the dose implanted in the buried portion 11 by limiting the gas pressure in the buried portion 11 and thus the risk of degrading the exposed surface 100. According to another example, it can be provided that several implantations of one same ion or mixture of ions are carried out at different depths, and potentially each followed by an exodiffusion annealing.

Figure 3:
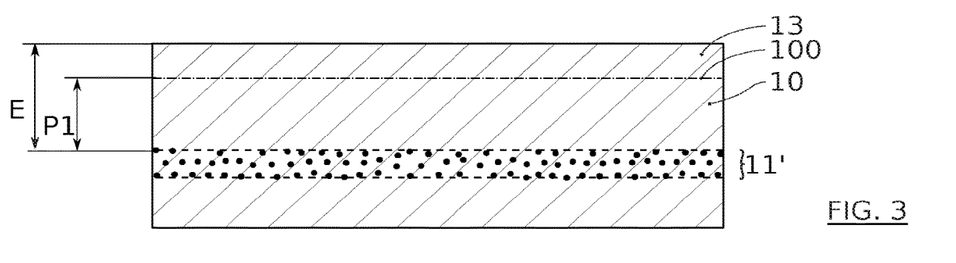
FIG. 3 represents an epitaxial growth of silicon on the superficial layer illustrated in FIG. 2A, according to an embodiment of the method according to the invention.
Figure 4:
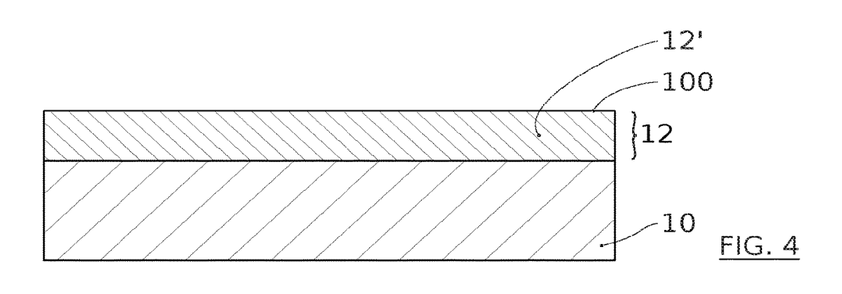
FIG. 4 illustrates the oxidation of the superficial layer of the support substrate illustrated in FIG. 1, according to an embodiment of the method according to the invention.

The method can further comprise an epitaxial growth of silicon on the surface 100 of the silicon-based superficial layer 10, so as to increase the thickness E of the superficial layer 10 of the support substrate 1, as illustrated in FIG. 3. More specifically, this epitaxial growth can be carried out by molecular jet epitaxy or by vapour-phase epitaxy. The thickness of the epitaxial silicon layer 13 is preferably less than 2 μm. It can thus be considered that the surface of the epitaxial silicon layer 13 forms a new surface 100 of the superficial layer 10.

The method further comprises the thermal oxidation of a superficial portion 12 of the superficial layer 10 to form an oxide layer 12' extending from the surface 100 of the superficial layer 10. Preferably, the oxide layer 12' formed extends substantially into the whole main extension plane of the superficial layer 10. More preferably, the oxide layer 12' extends substantially into the whole main extension plane of the layer 10, in an uninterrupted manner. The oxidation and the implantation of ions are further configured such that the oxide layer 12' and the porous silicon layer 11' are juxtaposed. There is therefore a juxtaposition interface between these two layers, which are in contact. The relative order, as well as the parameters of one and/or the other of the ion implantation and the oxidation can be adjusted to this. As stated above, this interface is of a thickness less than substantially 3 nm.

In the case where the implantation occurs before the thermal oxidation, it can be considered that during the thermal oxidation, a portion, i.e. a thickness, of the porous layer 11', is oxidised. More specifically, it is the semi-conductor constituting the solid portion of the porous layer which is oxidised. If the semi-conductor is silicon, the oxide is $SiO_2$. According to this example, the juxtaposition interface can have a thickness substantially comprised between 3 nm and 100 nm.

Figure 5:
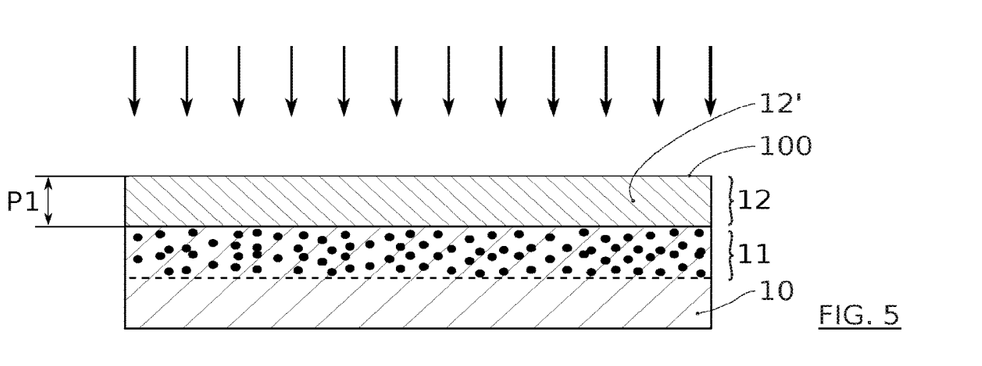
FIG. 5 illustrates the ion implantation in a portion of the superficial layer of the support substrate illustrated in FIG. 4, according to an embodiment of the method according to the invention.

According to an embodiment variant, the method does not comprise any thermal oxidation of the superficial layer 10 of the support 1. According to this variant, a stack 2, subsequently described, comprises an oxide layer, the oxide layer being intended to be directly bound to the surface 100 of the layer 10. According to an embodiment, the thermal oxidation can be carried out on the support substrate 1, prior to the ion implantation. This embodiment is described in reference to FIGS. 4 and 5. The support substrate 1 can be exposed to an oxidiser, during a high-temperature annealing, so as to oxidise the silicon of a superficial portion 12 of the superficial layer 10, to form a silicon oxide layer 12'. Generally, the temperature of a thermal oxidation is comprised between 800° C. and 1200° C. At least one from among the temperature, the duration of the thermal oxidation can be adapted so as to modulate the thickness of the oxide layer 12' formed. For example, the higher the temperature is, and/or the longer the duration of the thermal oxidation is, the thicker the oxide layer 12' will be. The thickness of the oxide layer 12' can be comprised between 20 nm and 400 nm. The ion implantation can then be carried out on the support substrate 1, according to the features described above. For this embodiment, the parameters of the ion implantation will be selected such that the buried portion 11 is juxtaposed to the oxide layer 12' formed, as illustrated by FIG. 5. Thus, it is avoided that the microstructure of the porous silicon layer is modified during the thermal oxidation.

Figure 6A:
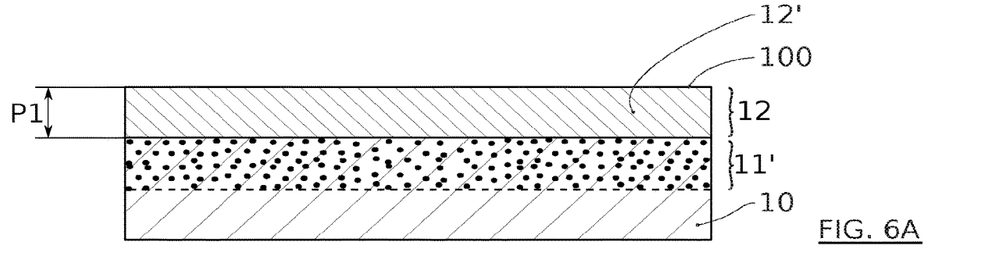
FIGS. 6A and 6B represent the superficial layer of the support substrate obtained after ion implantation, the thermal annealing and the thermal oxidation, according to two embodiments of the method according to the invention.
Figure 6B:
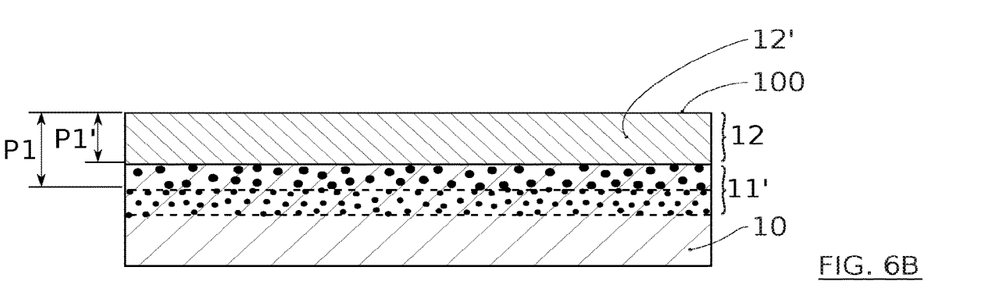

According to another embodiment, described in reference to FIGS. 6A and 6B, the ion implantation can be carried out on the support substrate 1, according to the features described above. The thermal oxidation can then be configured so as to oxidise the superficial portion 12 of the layer 10, this portion extending from the surface 100 of the superficial layer 10 to the buried portion 11. For this, as above, at least one from among the temperature and the duration of the thermal oxidation can be adapted so as to modulate the thickness of the oxide layer 12'. Thus, it is avoided that the oxide layer 12' disrupts the ion implantation in the buried portion 11 of the superficial layer 10 of the support substrate 1. The ion implantation at a significant depth of the support substrate is thus facilitated. A buried oxide layer thicker in the state of the art can therefore be obtained.

When the method comprises an ion implantation and an epitaxial growth of silicon, followed by the thermal oxidation, the thickness of the portion 12' can be greater than 400 nm, for example up to 2 μm. It is thus understood that the epitaxial growth of silicon allows to also increase the thickness of the oxide layer 12'.

Furthermore, by carrying out the thermal oxidation after ion implantation, the risk of a possible deterioration of the oxide layer 12' by ion implantation in the buried portion 11, is minimised, even avoided. This embodiment, is thus particularly adapted for applications where a high quality of the buried oxide layer is preferred. According to a particular embodiment, it can be provided to carry out a first implantation before the oxidation and a complementary implantation after oxidation to reduce damage in the oxide.

According to one or the other of the embodiments described, the superficial layer 10 comprises a porous silicon layer 11', this layer could comprise a plurality of sublayers, and a juxtaposed oxide layer 12', the oxide layer 12' extending up to the surface 100 of the superficial layer 10. The roughness of the oxide layer 12' can be of the order of 5 Å.

Figure 7:
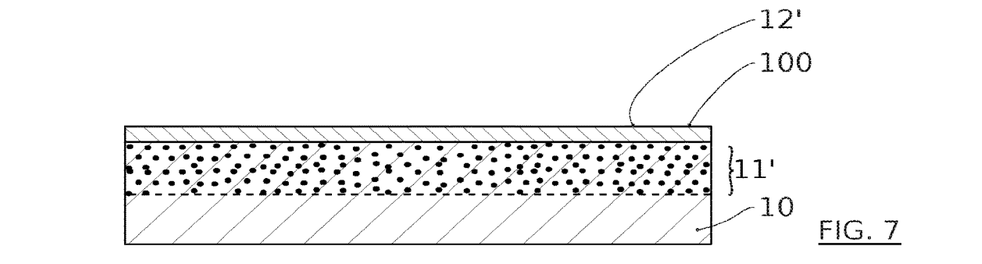
FIG. 7 represents the superficial layer of the support substrate obtained after an etching of the oxide layer, of the superficial layer illustrated in FIG. 6A, according to an embodiment of the method according to the invention.

According to a particular embodiment, the oxide layer 12' is a layer of a thickness less than the thickness of the buried oxide layer obtained during the subsequent assembly of the support substrate 1 and of the donor substrate 2 to form the SOI type multilayer stack. In this case, the thickness of the buried oxide layer of the multilayer stack can in particular be increased by the donor substrate 2, this example being described in more detail below. The buried oxide layer of the multilayer stack can thus be provided mainly by the donor substrate 2. The method can, for this, comprise an etching of the oxide layer 12'. Resorting to etching allows to avoid having to implant ions in a buried portion 11 close to the surface 100 of the superficial layer 10, which could deteriorate the state of this surface 100. It is indeed possible to carry out the ion implantation, at a depth guaranteeing the integrity of the surface 100 of the superficial layer 10, and the thermal oxidation, in one or the other of the relative orders described above. Then, the oxide layer 12' can be etched to reaching the desired thickness. Preferably, the thickness of the oxide layer 12' after etching is substantially less than 20 nm. This etching can be a conventional wet etching, by implementing a hydrofluoric acid solution. According to an embodiment variant, it is possible to completely etch the oxide layer 12' in order to expose a non-oxidised monocrystalline silicon layer in view of a bonding with a stack 2. The stack 2, subsequently described, thus comprises an oxide layer, the oxide layer being intended to be directly bound to the surface 100 of the layer 10.

Figure 8:
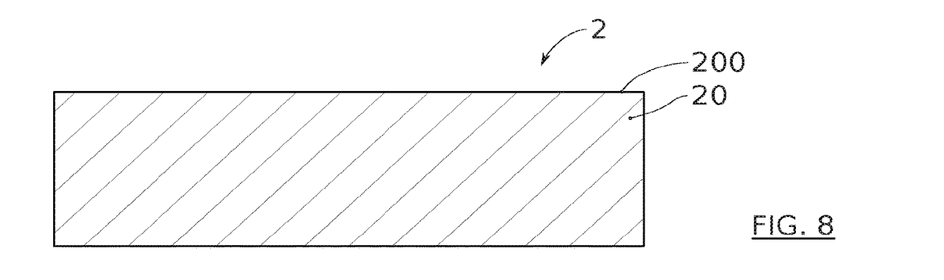
FIG. 8 represents a schematic and transversal cross-sectional view of the superficial layer of a donor substrate implemented in the method according to an embodiment.

According to an embodiment of the invention, the steps of the method relating to the donor substrate are now described in reference to FIGS. 8 to 10B. The method first comprises the provision of a donor substrate 2, as illustrated in FIG. 8. Like for the support substrate 1, the donor substrate 2 comprises a superficial donor layer 20 based on a monocrystalline semi-conductive material. It is noted that FIGS. 8 to 12B, only the superficial layer 20 of the donor substrate 2 is represented. The layer 20 is therefore situated on the surface of the donor substrate 2 and has an exposed surface 200. The donor substrate 2 is based on a semi-conductive material. As an example, the semi-conductive material can be selected from among silicon, or semi-conductive silicon alloys such as silicon carbide of formula SiC and a silicon-germanium alloy of formula Si—Ge. Below, the case where the semi-conductive material is silicon-based is referred to. The superficial donor layer 20 can further be only constituted of silicon, by neglecting the impurities linked to the production of silicon. The support substrate 2 can, for example, be a silicon wafer.

The method comprises the formation of a weakening zone 21 at a non-zero depth P2 of the surface 200 of the superficial donor layer 20. Preferably, the weakening zone 21 extends substantially in the whole main extension plane of the superficial donor layer 20. More preferably, the weakening zone 21 extends substantially in the whole main extension plane of the layer 20 in an uninterrupted manner.

This weakening zone is, for example, formed by ion implantation, such as hydrogen or helium ions. It is noted that any other technique for forming a weakening zone, and in particular any other technique used in methods for producing SOI type stacks, can be considered.

Figure 9:
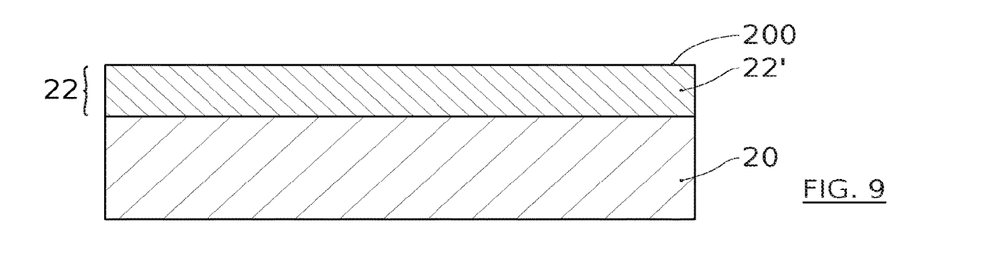
FIG. 9 illustrates the oxidation of the superficial layer of the donor substrate illustrated in FIG. 8, according to an embodiment of the method according to the invention.
Figure 10A:
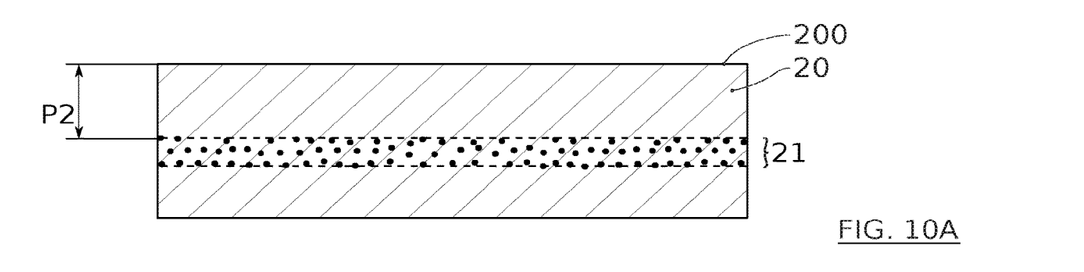
FIGS. 10A and 10B illustrate the ion implantation, according to several embodiments of the method according to the invention, in each of the portions of the superficial layer of the support substrate illustrated in FIGS. 8 and 9.
Figure 10B:
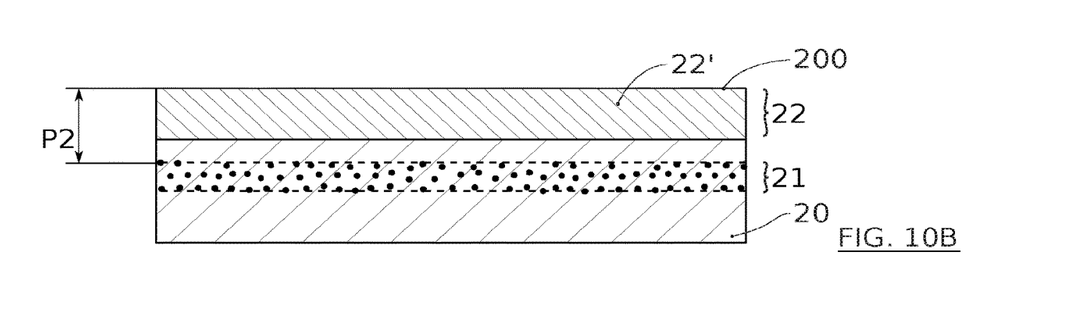

The method can further comprise an oxidation, for example thermal, of a superficial portion 22 of the superficial donor layer 20 to form an oxide layer 22' extending from the surface 200 of the superficial donor layer 20. This oxide layer 22' can more specifically be intended to form the buried oxide layer in the final SOI type stack. The thermal oxidation is preferably carried out before the formation of the weakening zone 21, as the passage of FIG. 9 to FIG. 10B illustrates. Thus, the risk of a separation of the weakening zone 21 during the oxidation is avoided. The formation of the weakening zone and the thermal oxidation are configured such that the distance between the oxide layer 22' and the weakening zone 21 is non-zero, along a direction perpendicular to the main extension direction of the oxide layer 22' and of the weakening zone 21.

Following the steps described above, aiming to prepare the support substrate 1 and the donor substrate 2, the method comprises the assembly of the support substrate 1 and of the donor substrate 2, so as to associate them. This assembly is described in reference to FIGS. 11A and 11B. This assembly is carried out by the putting into contact of the surface 100 of the superficial layer 10 of the support substrate 1 to the surface 200 of the superficial donor layer 20 of the donor substrate 2. When the oxide layer 12' extends to the surface 100, it is understood that the surface of the oxide layer 12 forms the assembly surface of the support substrate 1. The surfaces 100, 200 are then bound, and preferably by direct bonding.

Through the features of the method described above, and in particular thanks to the fact that the oxide layer 12' is formed by thermal oxidation, and that the ion implantation and the possible thermal annealing can be configured so as to guarantee the integrity of the surface 100 of the superficial layer 10 of the support substrate 1, the method can be exempt from a polishing of the surface 100 of the superficial layer 10, prior to the assembly. The method can further be exempt from a polishing of the surface 200, of the superficial donor layer 20, prior to the assembly. Preferably, the method is exempt from a polishing of each of the surfaces 100, 200. The method allows to obtain a quality binding of the support substrate 1 and of the donor substrate 2, in a simplified manner and with a limited cost.

Figure 11A:
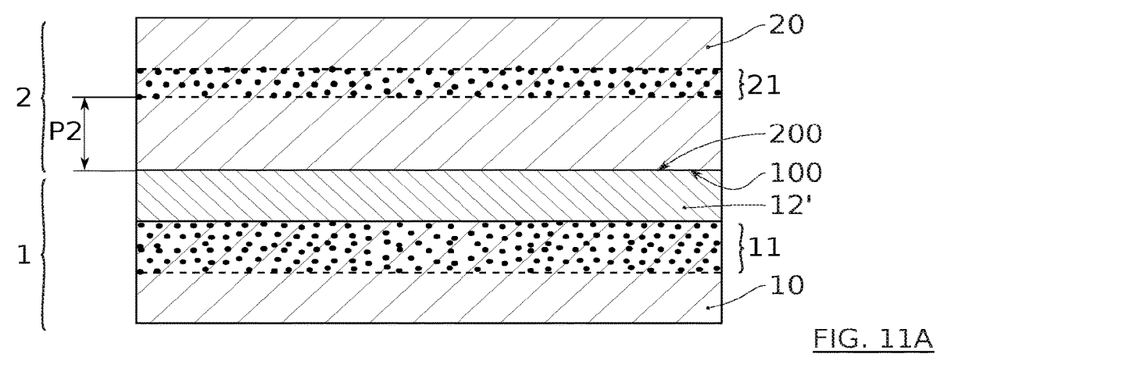
FIGS. 11A and 11B represent the assembly formed by the superficial layer of the support substrate and the superficial layer of the donor substrate, according to two embodiments of the method according to the invention.
Figure 11B:
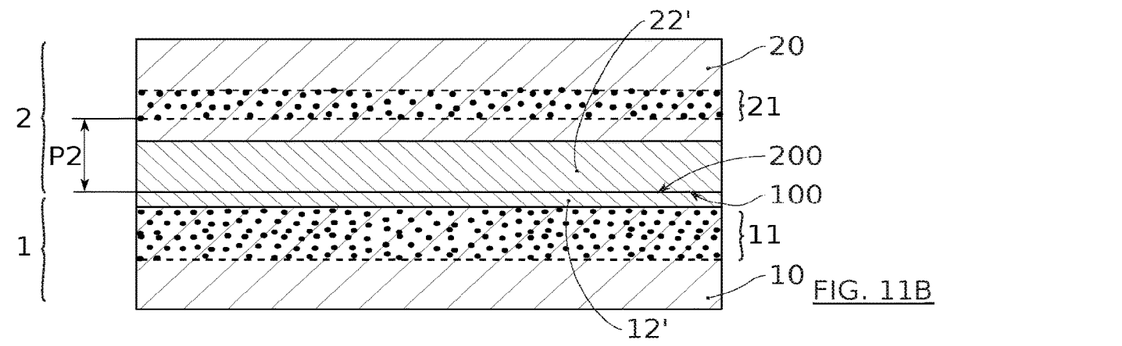
Figure 12A:
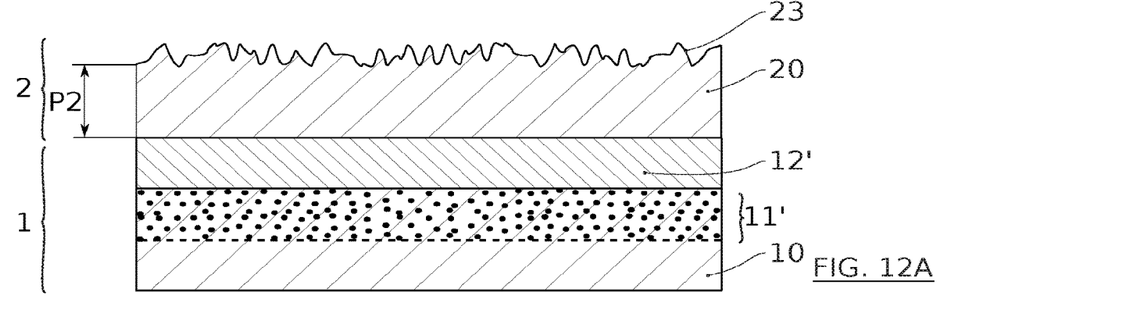
FIGS. 12A and 12B represent the assembly obtained by the separation of the donor substrate, from each of the assemblies illustrated in FIGS. 11A and 11B, according to an embodiment of the method according to the invention.
Figure 12B:
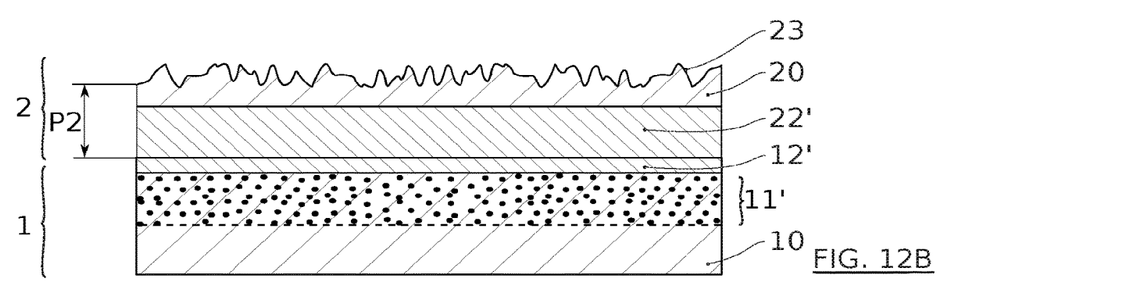

Two particular embodiments are now described in reference to FIGS. 11A and 11B. According to a first example illustrated in FIG. 11A, the support substrate 1 can comprise a superficial layer 10, this layer 10 comprising a porous silicon layer 11', juxtaposed to an oxide layer 12'. The oxide layer 12' extends to the surface 100 of the superficial layer 10, and can be of a thickness comprised between 5 nm and 2 µm. The donor substrate 2 comprises a superficial layer 20, this layer comprising the weakening zone 21 at a depth P2.

According to a second example illustrated in FIG. 11B, the support substrate 1 can comprise a superficial layer 10, this layer 10 comprising a porous silicon layer 11', juxtaposed to an oxide layer 12'. The oxide layer 12' extending to the surface 100 of the superficial layer 10 and can be of a thickness less than 20 nm. The donor substrate 2 comprises a superficial layer 20, this layer comprising an oxide layer 22' and a weakening zone 21 at a depth P2, the superficial donor layer 20 being configured such that the oxide layer 22' and the weakening zone 21 are not juxtaposed.

Following the assembly of the support substrate 1 and of the donor substrate 2, the method comprises the separation of the superficial donor layer 20 of the donor substrate 2, at the level of the weakening zone 21, such that a layer of a thickness P2 of the superficial donor layer 20 is assembled on the support substrate 1, like in the examples illustrated in FIGS. 11A and 11B. For this, the weakening zone 21 forms a separation surface 23.

Following the separation, the separation surface 23 can be irregular. A chemical and/or mechanical and/or thermal polishing or smoothing of the separation surface 23 can be carried out, such that the separation surface 23 has a roughness adapted for other subsequent methods such as methods for producing electronic modules, and more specifically, RF-SOI module. The polishing of the separation surface 23 can, for example, be illustrated by the passage of FIG. 12A to FIG. 13A. Any chemical mechanical polishing (CMP) or thermal method intended to smoothen a silicon-based surface can be considered. For example, the separation surface 23 is oxidised to taper it to a desired thickness then treated by a high-temperature annealing in the presence of hydrogen in the atmosphere of the annealing.

Figure 13A:
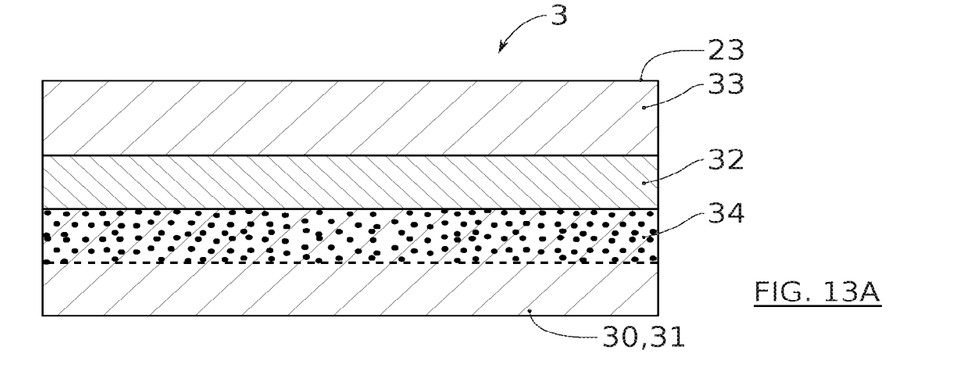
FIGS. 13A to 13C represent the multilayer stack according to several embodiments of the invention.
Figure 13B:
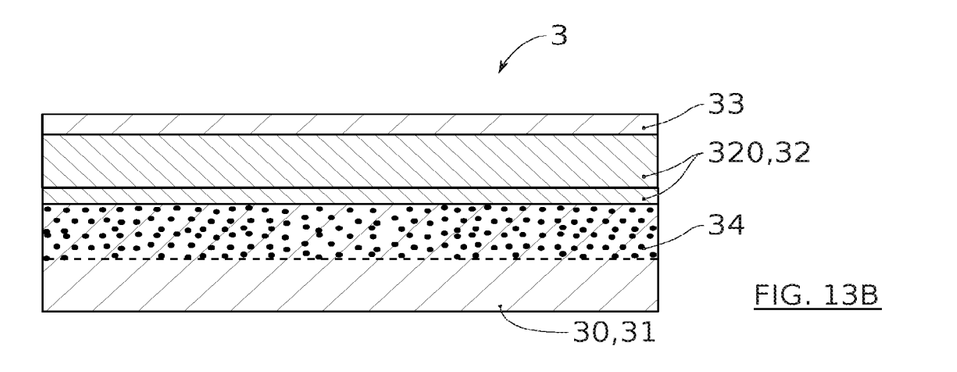
Figure 13C:
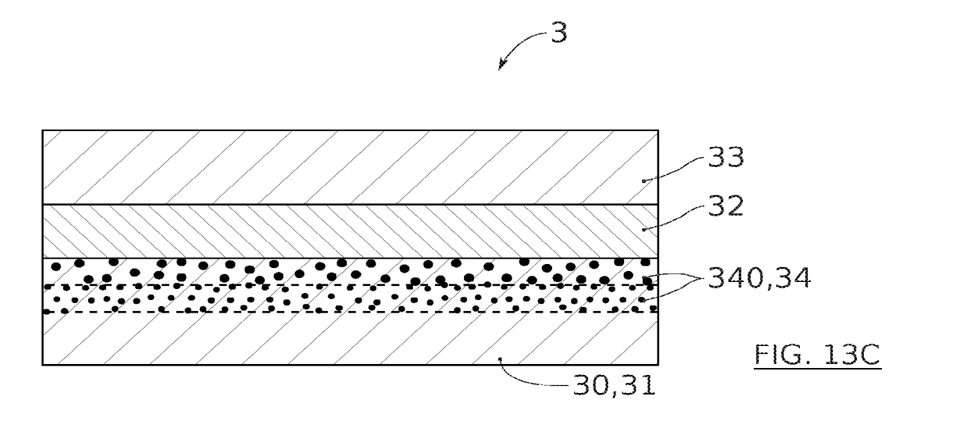

The multilayer stack 3 is now described in reference to FIGS. 13A to 13C. The multilayer stack 3 can more specifically be obtained by the method described above.

The multilayer stack 3 comprises a support substrate 30 comprising a first monocrystalline silicon-based layer 31. This first layer 31 is juxtaposed to a porous silicon layer 34. The multilayer stack 3 further comprises a buried silicon oxide layer 32 disposed in contact between the porous silicon layer 34 and a second monocrystalline silicon-based layer 33. The second layer 33 can be disposed on the surface of the multilayer stack 3. Thanks to the direct juxtaposition of a porous silicon layer 34 to the oxide layer 32, the properties of the stack 3 are improved, in particular for radiofrequency (RF) applications. By juxtaposition, this means a recovery of the different layers on top of one another along a vertical direction, perpendicular to the main extension plane thereof. Furthermore, the quantity of traps in the layer depends on the surface of the pores in the layer. By varying the pore microstructure(s), the trapping properties of the porous layer can be modulated.

The features described above of the porous silicon layer 11', oxide layers 12', 22' can be applied to the porous silicon layer 34 and to the oxide layer 32 of the multilayer stack.

According to an example, the oxide layer 32 can moreover comprise several sublayers 320, and more specifically two sublayers 320, as illustrated in FIG. 13B. According to an alternative or complementary example, the porous silicon layer 34 can comprise several juxtaposed sublayers 340. At least one from among sublayers 340 can have pores of a different diameter from the diameters of the pores of the other sublayers 340. Preferably, several sublayers 340 form a porous silicon layer 34 having a porosity gradient along a direction perpendicular to the main extension direction of the porous silicon layer 34.

The multilayer stack 3 can further be integrated in an RF-SOI module.

In view of the description above, it appears clearly that the invention proposes a method for manufacturing an SOI type multilayer stack, and in particular for RF-SOI technologies, of which the properties are improved. This method further allows to facilitate the manufacturing of an SOI type substrate, and in particular for RF-SOI technologies.

The invention is not limited to the embodiments described above and extends to all the embodiments covered by the claims.

It can in particular be provided that the method comprises several ion implantations in the superficial layer 10 of the support substrate 1; non-successively. At least one of these ion implantations could be carried out before the thermal oxidation, and at least one of these ion implantations could be carried out after the thermal oxidation.

It can further be provided that an ion implantation is configured such that a porous silicon layer 11' is formed, and not in contact with the oxide layer 12' or to another porous silicon layer 11'. The multilayer stack 3 obtained could thus comprise a second buried silicon layer in the monocrystalline silicon-based layer of the support substrate, and not in contact with the oxide layer 32 or to the first porous silicon layer 34.

It can be provided to carry out a plurality of oxidation sequences, ion implantations, even annealings. It can further be provided to assemble the support substrate without etching the oxide layer to a donor substrate comprising an oxide layer, to obtain a thicker oxide.

LIST OF REFERENCES

1 Support substrate
10 Superficial layer
100 Surface
11 Buried portion
11a Sub-portion
11b Sub-portion
110 Microstructure
110a First microstructure
110b Second microstructure
11' Porous silicon layer
12 Superficial portion
12' Silicon oxide layer
13 Silicon epitaxial layer
2 Donor substrate
20 Superficial donor layer
21 Weakening zone
22 Superficial portion
22' Silicon oxide layer
23 Separation surface
3 Multilayer stack
30 Support substrate
31 First monocrystalline silicon-based layer
32 Silicon oxide layer
320 Sublayer
33 Second monocrystalline silicon-based layer
34 Porous silicon layer
340 Sublayer
E Thickness of the superficial layer of the donor substrate
P1 Depth of the surface of the superficial layer of the support substrate
P1' Second depth of the surface of the superficial layer of the support substrate
P2 Depth of the surface of the superficial donor layer of the donor substrate

The invention claimed is:

1. A method for producing a semi-conductor-on-insulator type multilayer stack, the method comprising:
providing a support substrate, the support substrate comprising a superficial layer based on a monocrystalline semi-conductive material, then
performing an ion implantation with ions selected from among noble and hydrogen gas ions, the ions being implanted in a buried portion of the superficial layer of the support substrate at a depth P1 of the surface of the superficial layer, so as to form a layer enriched with at least one gas, formed from said ions, in said buried portion, said layer enriched with at least one gas being configured to form a porous semi-conductive material layer,
after the performing the ion implantation, thermally oxidating at least one superficial portion of the superficial layer, to form an oxide layer extending from the surface of the superficial layer of the support substrate, the oxidation and the implantation of ions being configured such that the oxide layer and the layer enriched with at least one gas are juxtaposed,
providing a donor substrate, the donor substrate comprising a superficial donor layer, having a surface, then
assembling the support substrate and the donor substrate,
wherein the ion implantation in the buried portion of the superficial layer of the support substrate precedes the thermal oxidation of the superficial portion of the superficial layer of the support substrate,
wherein the method further comprises, between the ion implantation in the buried portion of the superficial layer of the support substrate and the thermal oxidation of the superficial portion of the superficial layer of the support substrate, an epitaxial growth of a semi-conductive material layer on the surface of the superficial layer of the support substrate.

2. The method according to claim 1, wherein the method is exempt from a polishing of the surface of at least one from among the superficial layer of the support substrate and the superficial donor layer of the donor substrate, prior to the assembly of the support substrate and of the donor substrate.

3. The method according to claim 1, further comprising a thermal annealing of the support substrate following the ion implantation in the buried portion of the superficial layer of the support substrate.

4. The method according to claim 3, wherein the thermal annealing comprises an exodiffusion annealing to discharge the at least one gas from said enriched layer.

5. The method according to claim 1, wherein the ion implantation in the buried portion of the superficial layer of the support substrate is carried out at an implantation energy comprised between 0.5 keV and 1 MeV.

6. The method according to claim 1, wherein the ion implantation in the buried portion of the superficial layer of the support substrate is carried out at an implantation energy comprised between 1 and 200 keV.

7. The method according to claim 1, wherein the method comprises several ion implantations, preferably successive.

8. The method according to claim 7, wherein the several ion implantations are successive.

9. The method according to claim 7, wherein the chemical elements of the ions and/or the relative proportions between ions of different chemical elements vary between the different ion implantations.

10. The method according to claim 7, wherein at least one from among the several ion implantations is carried out at a different implantation depth with respect to the implantation depths of the other ion implantations.

11. The method according to claim 7, wherein at least one from among the several ion implantations is configured to implant a different dose with respect to the implanted doses of the other ion implantations.

12. The method according to claim 1, wherein the thermal oxidation forming the oxide layer forms a juxtaposition interface with the layer enriched with at least one gas, wherein at least one portion of the layer enriched with at least one gas is oxidised.

13. The method according to claim 12, wherein the juxtaposition interface has a thickness of between 3 nm and 100 nm.

* * * * *